United States Patent
Carrozzi et al.

(10) Patent No.: US 6,346,815 B1
(45) Date of Patent: Feb. 12, 2002

(54) FARADAY CAGE, PARTICULARLY FOR NUCLEAR MAGNETIC RESONANCE APPLICATIONS

(75) Inventors: Alessandro Carrozzi, La Spezia; Fabio Rezzonico, Como; Pierluigi Giusto, Cogoleto; Luigi Satragno, Genoa; Eugenio Biglieri, Masio, all of (IT)

(73) Assignee: Esaote S.p.A., Monferrato (IT)

( * ) Notice: Subject to any disclaimer, the term of this patent is extended or adjusted under 35 U.S.C. 154(b) by 0 days.

(21) Appl. No.: 09/427,758

(22) Filed: Oct. 27, 1999

(30) Foreign Application Priority Data

Nov. 26, 1998 (IT) ......................................... SV98A0068

(51) Int. Cl.⁷ ................................................ G01V 3/00
(52) U.S. Cl. ........................ 324/318; 324/309; 324/322
(58) Field of Search ................................ 324/318, 309, 324/316, 322

(56) References Cited

U.S. PATENT DOCUMENTS

| | | | |
|---|---|---|---|
| 4,564,812 A | 1/1986 | Van Dijk | 324/309 |
| 4,613,820 A * | 9/1986 | Edelstein et al. | 324/18 |
| 4,753,038 A | 6/1988 | Sohlström | 49/212 |
| 5,043,529 A | 8/1991 | Vanesky et al. | 174/35 |
| 5,573,000 A * | 11/1996 | Goffer et al. | 324/18 |

FOREIGN PATENT DOCUMENTS

| | | |
|---|---|---|
| CH | 666 076 | 6/1988 |
| DE | 3519365 A1 | 4/1986 |
| DE | 4011660 | 10/1991 |
| EP | 0 503 106 A1 | 8/1991 |
| GB | 2 234 636 | 2/1991 |
| JP | 4-059349 | 2/1992 |

* cited by examiner

*Primary Examiner*—Hezron Williams
*Assistant Examiner*—Brij B. Shrivastav
(74) *Attorney, Agent, or Firm*—Burns, Doane, Swecker & Mathis, L.L.P.

(57) ABSTRACT

The invention relates to a Faraday cage, particularly for Nuclear Magnetic Resonance applications, having walls which delimit a room, said walls being at least partially made of an electrically conductive material and connected to the ground or to a predetermined potential. According to the invention, the Faraday cage has a floor which rests at least partly on the ground and has such a construction that the weight is spread all over its surface.

According to a further characteristic, the floor wall is load-bearing and preferably consists of crossed load-bearing beams and load bearing panels therebetween.

The floor is electrically conductive and is connected at least electrically to the other walls of the cage.

33 Claims, 8 Drawing Sheets

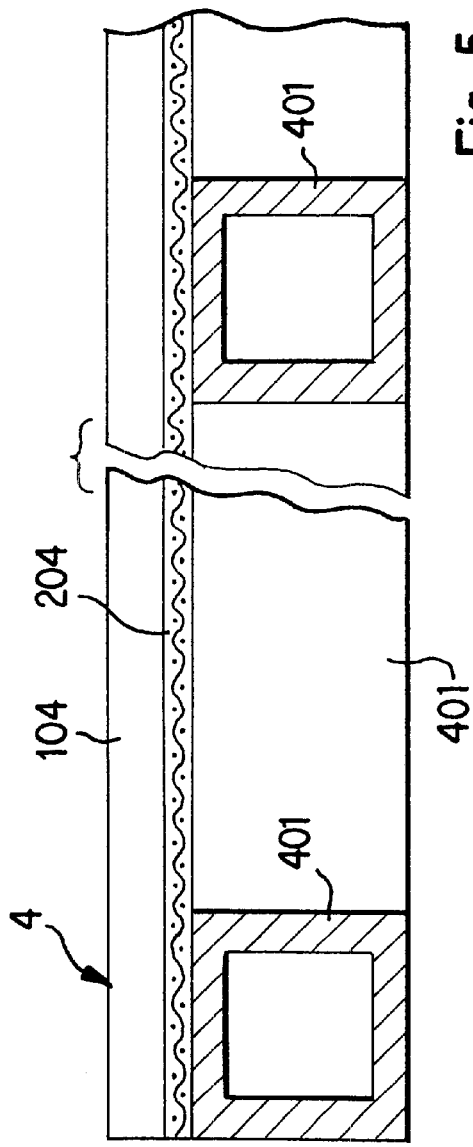
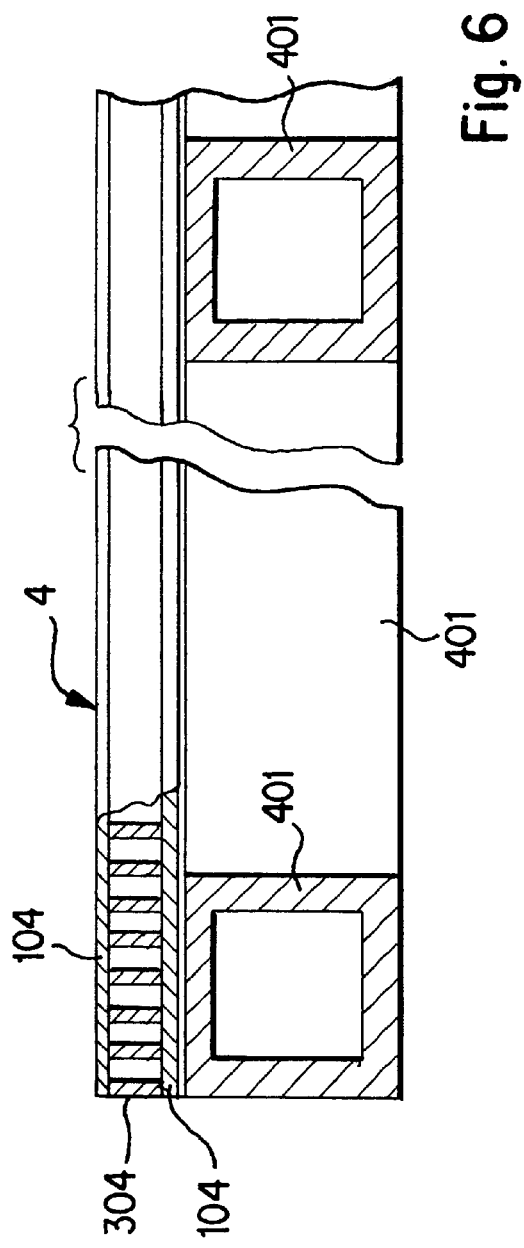

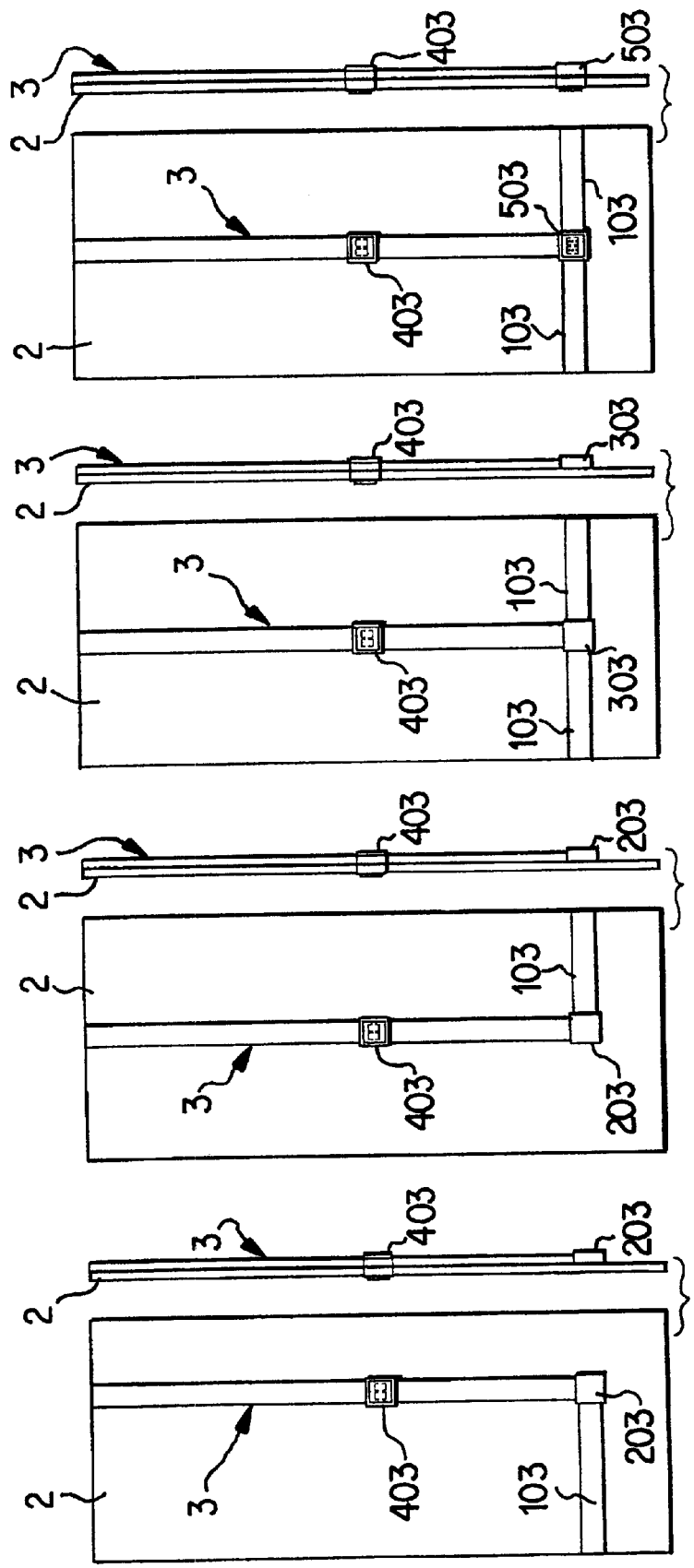

FARADAY CAGE, PARTICULARLY FOR NUCLEAR MAGNETIC RESONANCE APPLICATIONS

BACKGROUND OF THE INVENTION

The invention relates to a Faraday cage, particularly for Nuclear Magnetic Resonance applications, having walls which delimit a room, said walls being at least partially made of an electrically conductive material and connected to the ground or to a predetermined potential.

Although various solutions have been proposed for suppressing electromagnetic noise, such as grounding the patient body and/or the medical staff by appropriate arrangements, or using self-shielding equipment, the best solution always consists in a Faraday cage electromagnetic shield enclosing the equipment, the patient and the medical staff, when needed. Faraday cages are known in many different construction forms. Nevertheless, prior art cages do not solve, but increase in a sense, the problem of the static load of the Nuclear Magnetic Resonance imaging machine lying on the floor of the installation room. In fact, the machine load is added to the cage load.

Nuclear Magnetic Resonance imaging machines are very heavy and their huge weight is concentrated on a comparatively limited bearing surface.

This reduces considerably machine installation possibilities and, when installation rooms with suitable floors are not available, the installation of the machine requires costly building works for strengthening the floors in order that they can bear the load.

The invention has the object to provide, by simple and relatively inexpensive arrangements, a Faraday cage which allows to obviate the above problem thanks to a more flexible machine installation, especially for machines of the dedicated type, which are designed to ensure the maximum handiness and ease of use.

The invention also has the object to improve a Faraday cage such as the one described hereinbefore so as to make it more economical, safe and attractive for customers.

SUMMARY

The invention achieves the above purposes by providing a Faraday cage as described hereinbefore, having a floor which rests at least partly on the ground of the installation room and having such a construction that the weight is spread all over its surface.

In order to provide such a floor, any currently known building techniques and materials, particularly in the field of metal building may be used.

Advantageously, the floor of the Faraday has a bearing structure.

According to a preferred characteristic, the bearing structure preferably has a plurality of beams which are only parallel, or inserted in a peripheral framework or connected to each other at the ends of the peripheral walls of the cage or alternatively crossed, and a plurality of panels, also load-bearing, therebetween, whose size corresponds to the free space between the beams.

The panels may be fastened to the beams in such a manner as to be integral therewith and to form a whole bearing structure.

Alternatively, the panels only rest on the beams.

The panels may be shaped in such a manner as to lay on the ground or be lifted therefrom in the area between the load bearing beams.

The panels may be of any type and material.

They can be made of an electrically conductive material and connected electrically and mechanically to the beams or have a composite structure with at least a layer made of a conductive material which is electrically connected to the beams.

The panels may be made of various materials, such as metal, wool, plastic, and the like or combinations of said materials.

Composite panels may be used, having at least one inner honeycomb or grated core which is externally covered at least on one side with a flat plate.

Preferably, both outer sides are covered with a flat plate, which can be identical on both sides.

Particularly, advantages resulted from using a panel having a honeycomb aluminum core, covered on both faces with an aluminum plate.

One of the plates, e.g. the one designed to form the walking surface may be covered with a plastic plate or the like directly on the core or applied on the covering aluminum plate.

Wooden or plastic panels may be also used, by providing, for example, on the contact face between the latter and the beams a metal network or simple load bearing grates.

The cage itself may have any construction, preferably modular and prefabricated as well as enabling installation without requiring building works.

It has to be observed that the floor may also not be bound to the cage construction and installed later.

When the cage is modular and especially when the floor is in the form of prefabricated parts, they can be composed of a limited number of different types of substantially identical construction parts within the same type range. For instance, the walls may all be made by assembling elements of the same type, and the same may be provided, for instance, for opening/closing means.

Thanks to the above arrangements, a Faraday cage may be provided, particularly for MRI applications which, besides providing an effective electromagnetic shield, also allows to spread the weight of the machine over a large surface of the floor of the installation room, thereby limiting any requirement for strengthening or consolidation works on the floors.

Further characteristics and possible improvements of the invention will form the subject of the dependent claims.

The characteristics of the invention and the advantages derived therefrom will appear more clearly from the following description of a preferred embodiment;

BRIEF DESCRIPTION OF THE DRAWINGS

FIGS. 5 and 6 are cross sectional views of the Faraday cage floor with respect to a vertical plane, according to two non limiting embodiments.

FIGS. 7A, 7B, 7C, 7D, 7E, 7F, 7G, 7H show a front view and a side view of a modular panel, with various types of modular cable duct parts being applied thereon.

DETAILED DESCRIPTION OF PREFERRED EMBODIMENTS

Figure 1:
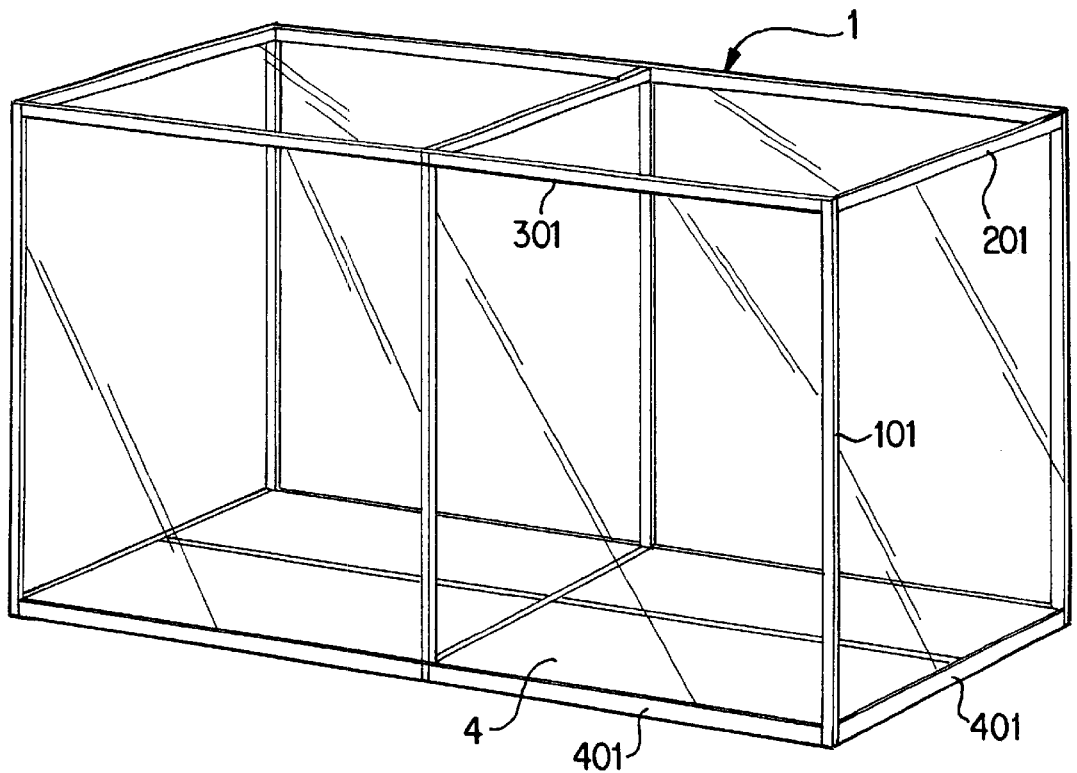
FIG. 1 is a perspective view of a schematic embodiment of a typical Faraday cage according to the invention.
Figure 3:
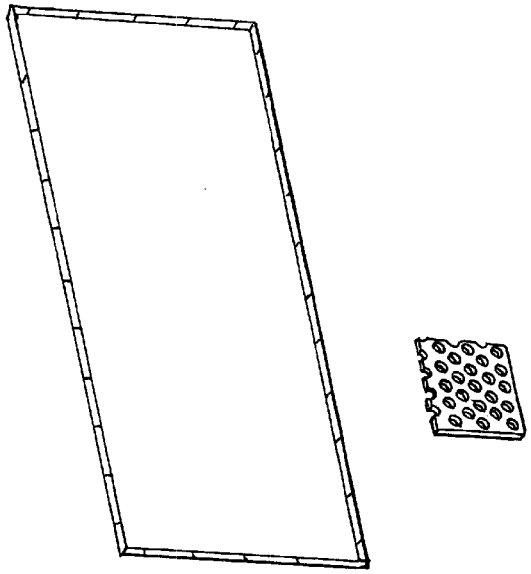
FIG. 3 is a perspective view of a modular construction part in the form of a plane rectangular panel.

With reference to FIG. 1, a Faraday cage according to the invention has a structure 1, for instance composed of uprights 101, crossbeams 201 and longitudinal members 301 fastened to each other preferably in a removable manner and so as to be in electrically conductive contact with each other.

Figure 4:
FIG. 4 shows a detail of the panel surface as shown in FIG. 3.

This structure 1 may have hook- or joint-like means for connection to the other components of the cage, such as, for instance, wall panels 2, for forming peripheral and/or ceiling walls, or the like. The panels 2 are made of an electrically conductive material, preferably of metal, and are provided with a plurality of apertures 102 all over the surface, as shown in FIG. 4.

Figure 2:
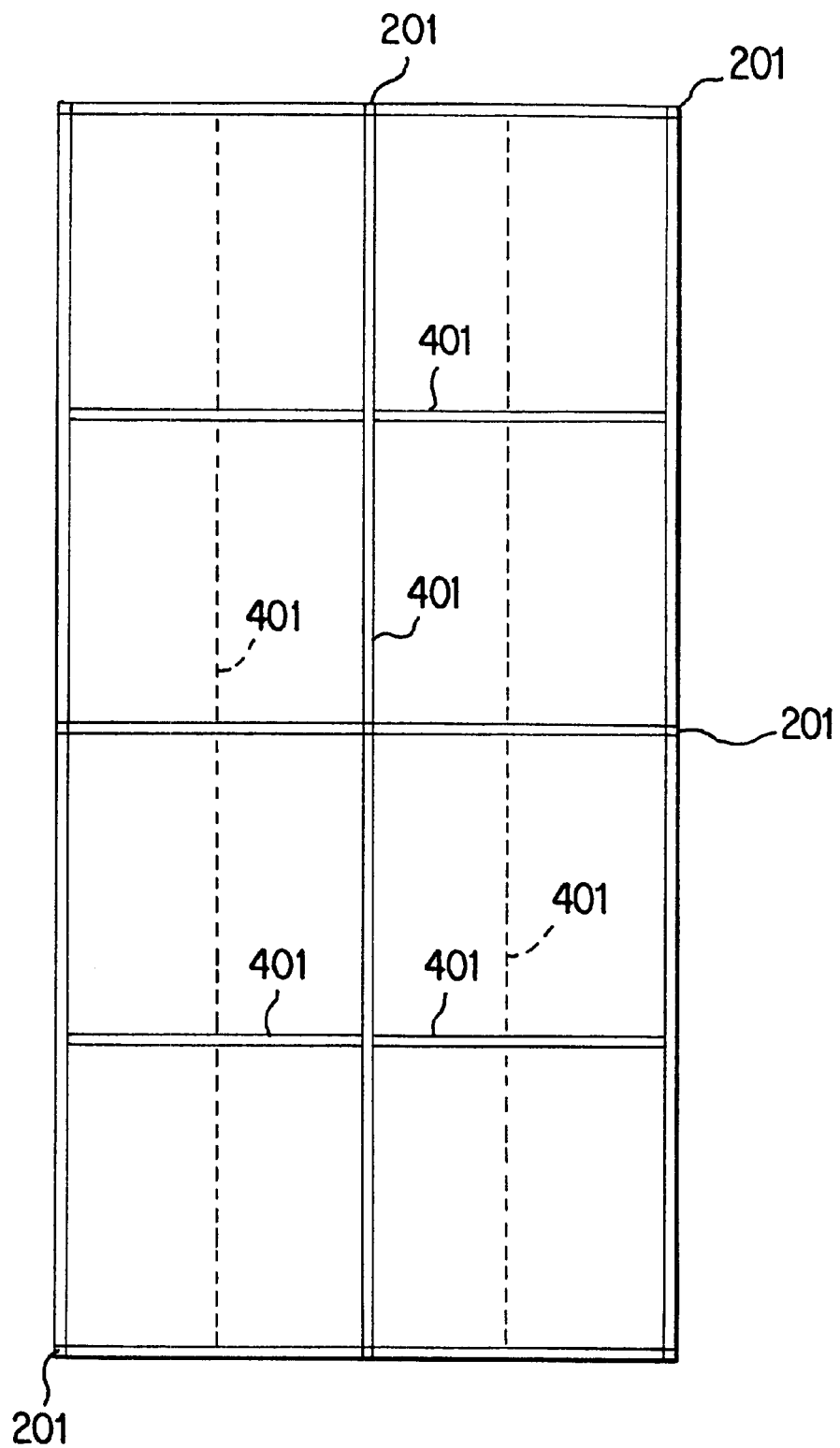
FIG. 2 is a plan view of the cage as shown in FIG. 1, the floor panels being omitted.
Figure 7D:
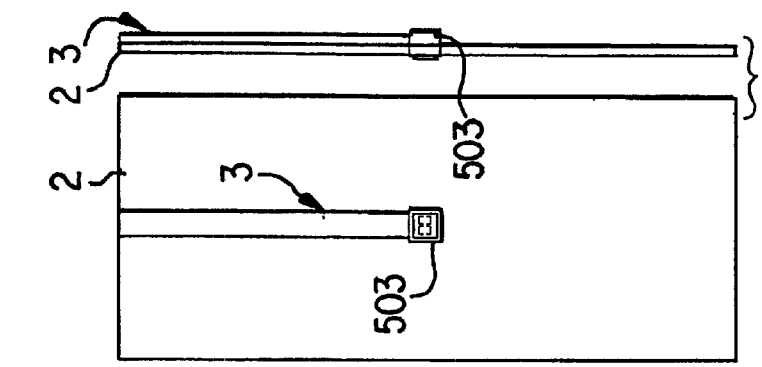
Figure 7C:
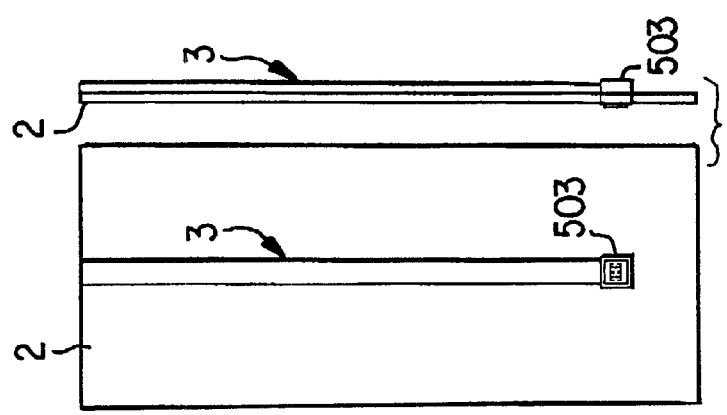
Figure 7B:
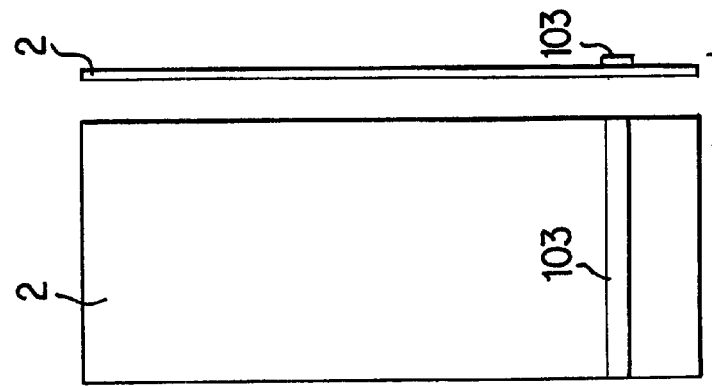
Figure 7A:
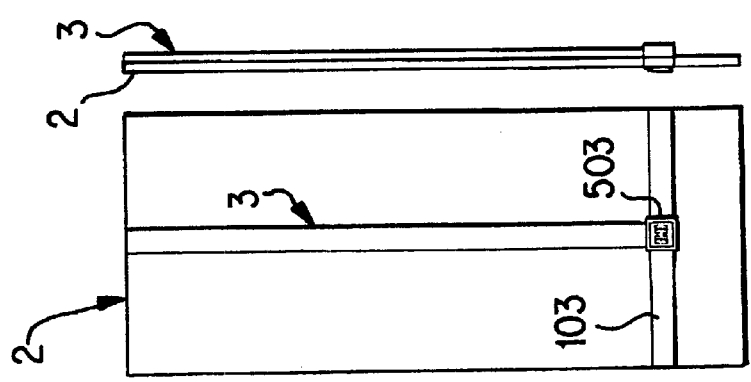

The floor of the Faraday cage according to the invention consists of a number of load bearing beams 401, which may be simply parallel to each other, connected to each other at their periphery, or may form a grate pattern as shown in FIG. 2. The number of beams 401 and the arrangement thereof as well as their having a solid or hollow section or specific shapes depends on construction characteristics, imposed by the designed use of the cage, especially on the machine type and on the weight thereof, as well as on lightness and material saving requirements. The floor beams 401 may be part of the bearing structure 1 of the cage. Therefore, the same types of modular prefabricated parts may be provided, as well as the same connection means, as provided for the bearing structure 1 of the cage. The beams 401 may consist each of a pair of coupled and superposed members, so that the strength thereof can be increased, without having to keep a great number of different beams in stock.

The floor beams 401 of the cage fully rest on the slab of the installation room and are provided in combination with load bearing floor panels 4, which may only rest on the floor frame or even, at least partly or fully, on the slab of the installation room.

Said panels 3 may have totally closed surfaces or have, at least partly, any type of apertures formed therein, e.g. for passage of service/lines.

The above floor embodiments have the purpose to spread the load of the cage content over a surface which is larger than the one covered by said content, particularly over the whole cage floor surface, and allow to install the cage and any MRI equipment included therein on a wider variety of slab types, whose strengths need not be specially calculated for the installation of said equipment.

Any type of floor panels 3 may be used, either made of an electrically conductive or of an insulating material, and either having a homogenous or a composite or laminated structure.

FIGS. 5 and 6 show two non limiting embodiments. The beams are made of metal and have a tubular section. The panels 4 rest thereon without touching the floor.

In FIG. 5, a floor panel 4 has two layers 104, 204, which may be separated from or fastened to each other.

The top layer 104, which forms the walking surface consists of a panel made of an electrically non conductive material and may have a homogeneous or composite structure, such as a panel made of wood, plastic, or the like. The layer 204 intervening between the beams 401 and the top layer 104 consists of a metal grate or network which, according to the construction, only has electrical connection functions or also combined support functions.

Obviously, the network or grating may also be made of plastic, when the electrical connection is not needed. The layer 104 may be further coated with a walking surface having finishing and nonslip functions, not shown in detail.

The embodiment of FIG. 6 shows a composite panel 4 having a honeycomb or grated intermediate layer 304, which is covered with a flat layer 104, at least on the walking side. Preferably, as shown, the core 304 is also covered on the bottom face, resting on the beams. Here again all variants and combinations may be provided. The three layers may be made of the same material or of different materials.

Particularly, the three layers 104, 304 are made of metal, preferably of aluminum, which provides a considerable strength, an easy machinability and a considerable lightness.

The top layer 104 may be provided in such a way as to form a finished floor or, like in the previous example, may be covered with a finishing layer, not shown.

With particular reference to FIG. 7, cable ducts 3 may be provided through the cage surfaces for housing service lines, such as electric and telephone lines, hydraulic lines, or the like. FIGS. 7 show a few modular cable duct types 3, which are preinstalled on a type of panel 2 of a modular cage, and may be assembled at the same time as the panels 2. Therefore, the panels 2 and the cable duct parts 3 have a corresponding modularity, so that they can be assembled in an easy and fast manner. Through proper combination of rectilinear duct parts 103, L- or T-shaped junctions 203, 303, junctions for light locations 403, power take-offs 503 or other elements, a wide range of pre-assembled cable duct parts 3 may be provided for connection to each other to meet any need.

Further, the pre-assembled cable duct parts 3 may be at least partly associated to the parts 101, 201, 301 of the structure 1, whereby they can be connected to each other upon connection of these parts. Alternatively thereto or in combination therewith, it is possible to provide that the cable ducts 3 are applied after assembling the cage. Here advantages are again obtained from providing the cable duct parts with modular features corresponding to the modular features of the cage.

Figure 8:
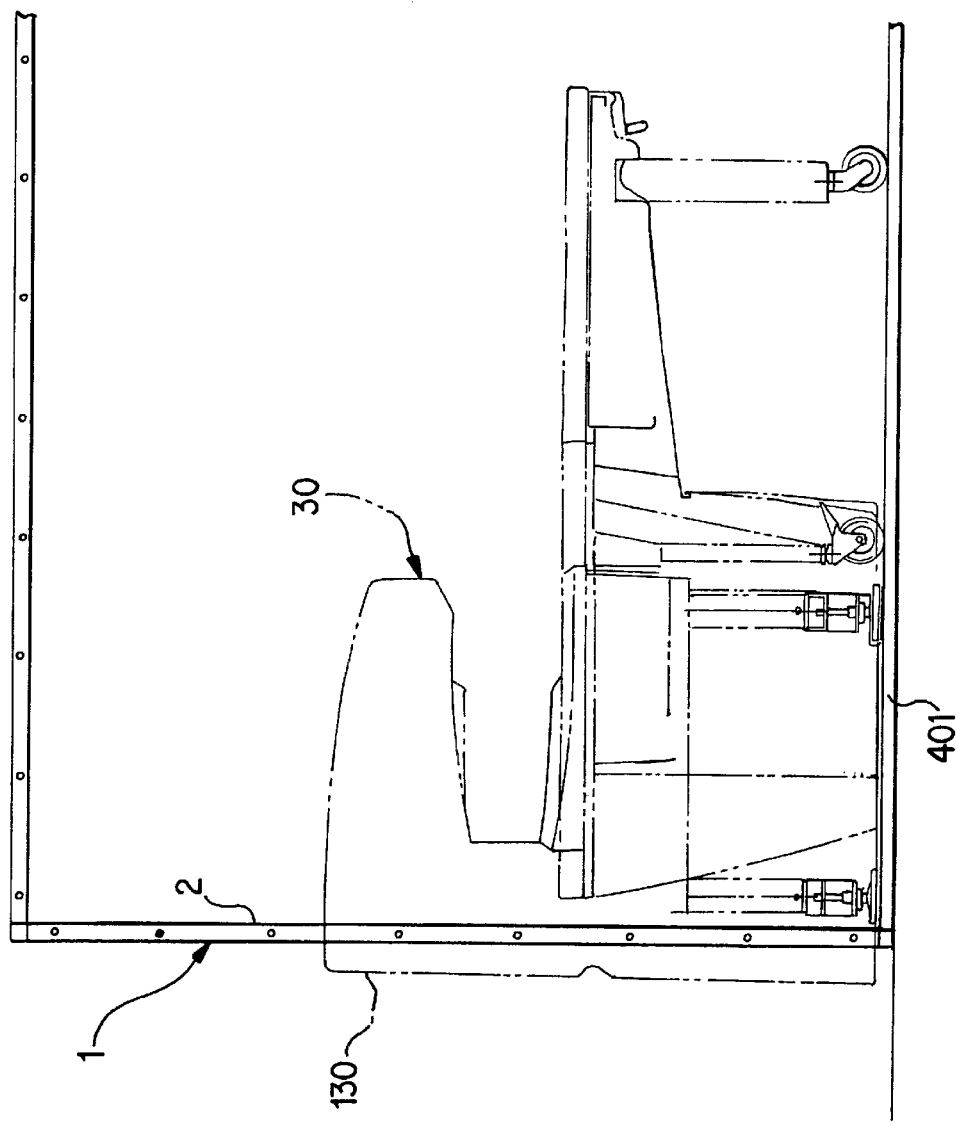
FIGS. 8 and 9 are a sectional view of a variant embodiment of the cage according to the invention with respect to a horizontal plane and with respect to a vertical plane respectively.
Figure 9:
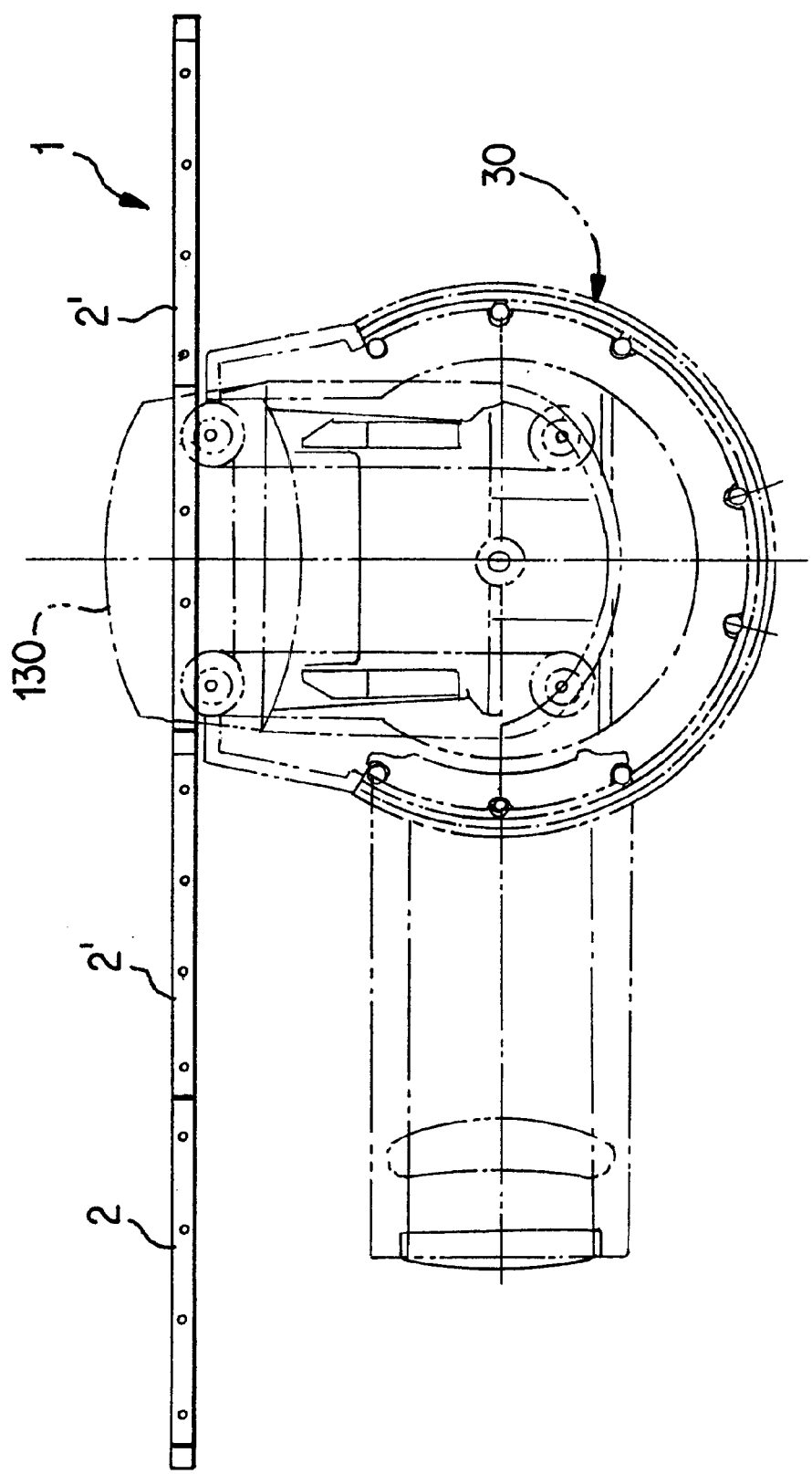

With reference to the variant embodiment of FIGS. 8 and 9 the peripheral side walls of the cage may consist of or at least partly include one of the case walls of a Nuclear Magnetic Resonance imaging machine 30, particularly of the magnet part of said machine.

In this case, both the machine 30 and the side wall modules 2 may have complementary sizes, so that, for example as shown, the rear wall 130 of the machine, i.e. of the magnet forms one of the wall modules.

Alternatively, and as shown, there may be provided side wall modules 2', whose size is such that they complement the panel 130, which forms the case of the machine 30, here the rear side thereof, or connect it to the adjacent wall panels 2. These integrating wall panels 2' may be preformed according to the shape of the case side of the machine 30 to be integrated in the wall structure, so that this wall may have a size substantially corresponding to the one of any modular wall panel 2. Since the shape of the case remains substantially the same, the provision of these special closing parts of the Faraday cage is not critical and may be easily adapted to various needs. Obviously, the covering or case wall/s 130 of the machine are appropriately made of an electrically conductive material or at least partly of such a material, and are connected to the other wall parts 2, 2' by fasteners which also ensure a low-resistance electric connection between said parts, such as screws or bolts.

Thanks to this arrangement, the overall dimensions of the Faraday cage may be reduced, and the machine may be connected, without requiring special shields, to an outside display 31 and to an outside electronic control unit 32.

Figure 12:
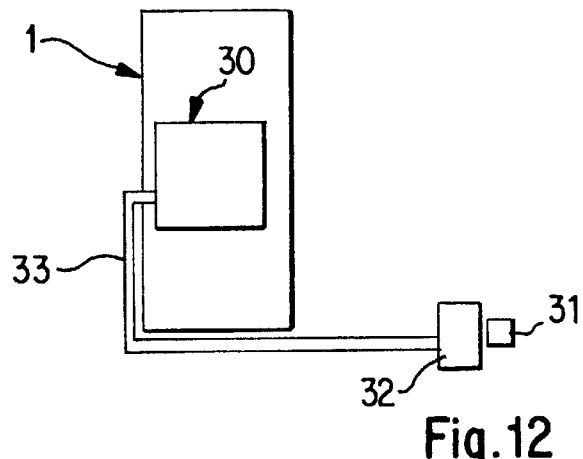

Such a condition is shown in FIG. 12. However, in this case, the machine is placed totally inside the cage, so the connection lines run at least inside the cage in a shielding raceway 33 which may be prefabricated or modular, as described in FIGS. 7A to 7H, and is electrically connected to the structure of the Faraday cage.

Figure 10:
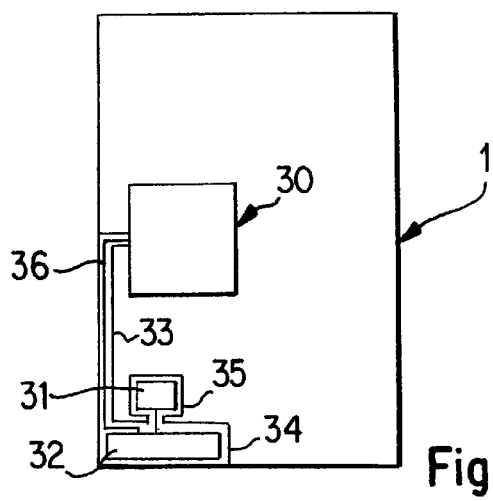
FIGS. 10 to 12 show plan views of the cage according to the invention in three different solutions for installation of a Nuclear Magnetic Resonance imaging machine.
Figure 11:
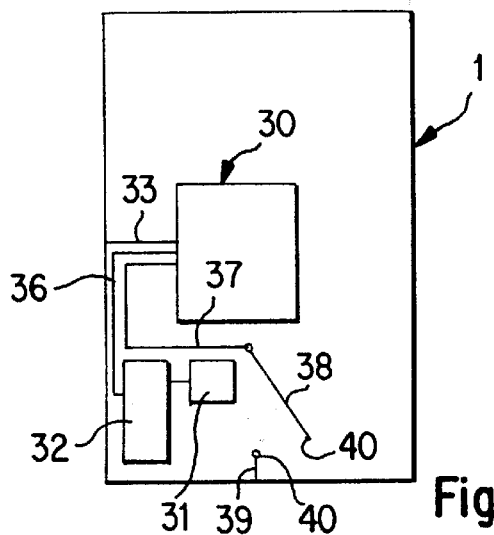

FIGS. 10 and 11 schematically show further machine position variants, particularly when the control central unit is separated therefrom.

In the variant of FIG. 10, the control unit 32 is enclosed in a shielding cabinet made of an electrically conductive material 34. In this case, the cabinet forms a separate Faraday cage which is in turn connected at least electrically to the Faraday cage containing the whole machine 30. The cabinet 34 may be prefabricated and with predetermined connections to at least one of the wall panels 2, in accordance with any modularity arrangement. Particularly, the cabinet may have a box-like structure with at least one openable or open side, which has flanges for fastening to a wall panel 2 by electric and mechanical connection means. The monitor may be also enclosed in a separate Faraday cage 35, whereas the cables 36 of the control unit 32, connecting to the machine 30 and to the monitor or other devices, run in shielding raceways 33, as indicated above with reference to FIGS. 7A to 7H and to FIG. 12.

In accordance with another embodiment of this variant, the control unit 32 and the monitor, as well as further control or command devices are mounted in such a way as to be accessed by at least one person which is in a properly shielded room, connected to the rest of the cage.

This room includes a partition wall which is substantially identical to a module and is provided at a corner of the non round area of the Faraday cage. On all the sides in contact with the upper, lower and lateral walls, the partition wall 37, which may consist of a wall module similar to the one denoted with numeral 2 in the above description, is fastened to the corresponding cage walls by screws, bolts or the like and in such a manner that these fasteners also generate an electric contact.

A further door panel forms a door wing 38 for accessing this room. This entrance door, which may be of the pivoting type, as schematically shown by its hinge, is electrically connected to the Faraday cage. When the door is in the closed condition, it abuts against an abutment frame 39 provided with mutual electric contact generating means 40 of the same type as those used for the sliding door.

In both embodiments of FIGS. 10 and 11, the cables of the central unit and/or of the monitor, for connection to the machine, or other cables designed to pass into the cage may be advantageously run in shielding raceways, as described above.

Obviously, the invention is not limited to the embodiments described and illustrated herein, but may be greatly varied, especially as regards construction, e.g. by providing a cage which has a size and/or shape differing even considerably from the one described above, without departure from the guiding principle disclosed above and claimed below.

What is claimed is:

1. A Faraday cage for Nuclear Magnetic Resonance applications, comprising walls which delimit a room, said walls being at least partially made of an electrically conductive material and connected to ground or to a predetermined potential, and a floor which rests at least partly on a surface of an installation room, and the Faraday cage floor has such a construction that it can support the weight of a magnetic resonance imaging system and spread the weight all over the floor of the Faraday cage.

2. A Faraday cage as claimed in claim 1, wherein the floor of the Faraday cage has a bearing structure.

3. A Faraday cage, as claimed in claim 1, wherein the cage has a modular construction.

4. The Faraday cage of claim 3, further comprising shielded cable ducts which are modular and can be coupled to the cage.

5. A Faraday cage, as claimed in claim 1, wherein the cage is constructed from a limited number of different types of construction elements which are substantially identical within each type range.

6. A Faraday cage, particularly for Nuclear Magnetic Resonance applications, comprising walls which delimit a room, said walls being at least initially made of an electrically conductive material and connected to ground or to a predetermined potential, and a floor which rests at least partly on a surface of an installation room and the Faraday cage floor has such a construction that the weight of contents of the Faraday cage is spread all over the floor of the Faraday cage, wherein shielded cable ducts are provided for housing service lines.

7. The Faraday cage of claim 6, wherein the shielded cable ducts are directly prefabricated on the walls.

8. A Faraday cage as claimed in claim 1, wherein it is provided in combination with a Nuclear Magnetic Resonance Imaging machine having a case with peripheral walls at least one peripheral wall of the case of said machine forming a part of a wall of the cage.

9. A Faraday cage as claimed in claim 8, wherein said at least one peripheral wall of the machine is made of an electrically conductive material and is electrically connected to adjacent parts of the wall of the cage.

10. A Faraday cage as claimed in claim 8, wherein the cage has a modular construction, and comprises modular wall panels, and the peripheral wall of the machine which forms a part of the wall of the cage has dimensions which are the same in one dimension to a modular side wall panel.

11. The Faraday cage of claim 10, wherein the peripheral wall of the cage has dimensions which are the same in two dimensions to a modular side wall panel.

12. A Faraday cage as claimed in claim 8, wherein the cage has a modular construction, and comprises modular wall panels, and there are provided further wall panels for connecting the wall of the machine adjacent modular wall panels the cage, said further wall panels being shaped in the form of a frame for integrating the wall of the machine into the dimensions of a modular panel.

13. A Faraday cage, particularly for Nuclear Magnetic Resonance application, comprising walls which delimit a room, said walls being at least partially made of an electrically conductive material and connected to ground or to a predetermined potential, and a floor which rests at least partly on a surface of an installation room and the Faraday cage floor has much a construction that the weight of contents of the Faraday cage is spread all over the floor of the Faraday cage, wherein the Faraday cage is provided in combination with a Nuclear Magnetic Resonance Imaging machine comprising, separately, one magnetic structure part and one control unit connected by wires, the magnetic structure part being positioned inside the Faraday cage and the control unit part being disposed outside the Faraday cage, and at least the portion of the wires connecting the magnetic structure part and the control unit situated inside the cage being led inside a shielding raceway made of an electrically conductive material, said raceway being electrically connected to the Faraday cage.

14. A Faraday cage, particularly for Nuclear Magnetic Resonance application, comprising walls which delimit a room, said walls being at least partially made of an electrically conductive material and connected to ground or to a predetermined potential, and a floor which rests at least partly on a surface of an installation room and the Faraday cage floor has such a construction that the weight of contents of the Faraday cage is spread all over the floor of the Faraday cage, wherein the Faraday cage is provided in combination with a Nuclear Magnetic Resonance Imaging machine comprising, separately, one magnetic structure part and one control unit, there being Nuclear Magnetic Resonance Imaging machine being located inside the cage, there being provided a housing having walls, which contains the control unit, said housing being made of an electrically conductive material and being electrically connected to the Faraday cage.

15. A Faraday cage as claimed in claim 14, characterized in that the housing for the control unit has such a volume that it can receive a possible service operator, at least one of the walls of the housing being made in the form of a wing which may be opened and closed and being provided with means for removable electric connection.

16. A Faraday cage as claimed in claim 14, characterized in that the housing has a modular construction.

17. The Faraday cage of claim 1, wherein the floor comprises a framework and a plurality of load-bearing floor panels supported by said framework.

18. The Faraday cage of claim 17, wherein the framework comprises a plurality of beams.

19. The Faraday cage of claim 18, wherein each beam is connected to at least one other beam.

20. The Faraday cage of claim 17, wherein the load-bearing floor panels are fastened to the framework.

21. The Faraday cage of claim 17, wherein the framework and load-bearing floor panels are electrically connected.

22. A Faraday cage as claimed in claim 1, wherein the magnetic resonance imaging system is a dedicated system.

23. A Faraday cage, particularly for Nuclear Magnetic Resonance applications, comprising walls which delimit a room, said walls being at least partially made of an electrically conductive material and connected to ground or to a predetermined potential, and a floor which rests at least partly on a surface of an installation room and the Faraday cage floor has such a construction that the weight of contents of the Faraday cage is spread all over the floor of the Faraday cage;
wherein the floor of the cage includes a framework composed of one or more beams, which may be parallel, connected or not to each other at their periphery and/or to the rest of the cage, or crossed in a predetermined pattern, which beams wholly rest on the surface floor of the room, said beams being provided in combination with load-bearing floor panels, which rest on the floor framework only, or also at least partially or completely on the slab of the room, or are fastened on the side of the beams in a mechanically load-bearing manner.

24. A Faraday cage as claimed in claim 23, characterized in that the beams and/or the floor panels are connected to each other and/or to the rest of the cage only electrically, only mechanically or both electrically and mechanically.

25. A Faraday cage as claimed in claim 23, characterized in that the floor panels are made of an electrically conductive material and are electrically and mechanically connected to the beams, or have a composite structure including at least one layer made of a conductive material which is electrically connected to the beams or are provided in combination with or superposed on layers, plates or the like made of an electrically conductive material.

26. A Faraday cage as claimed in claim 23, characterized in that the floor panels are made of an electrically non conductive material.

27. A Faraday cage as claimed in claim 23, characterized in that the floor panels have a composite multilayer structure with at least one inner honeycomb core which is externally covered at least on one side with a flat plate.

28. A Faraday cage as claimed in claim 27, wherein the honeycomb core is made of aluminum, and is covered on both sides with an aluminum plate.

29. A Faraday cage as claimed in claim 27, wherein the honeycomb core is made of a non-metal material.

30. The Faraday cage of claim 29, wherein the honeycomb core is made of plastic.

31. A Faraday cage as claimed in claim 27, wherein the floor panels have a flat plate as their upper side which is externally covered with a finishing material, such as an nonslip and/or sound-absorbing material.

32. A Faraday cage for Nuclear Magnetic Resonance applications, comprising walls which delimit a room, said walls being at least partially made of an electrically conductive material and connected to ground or to a predetermined potential, and a floor which rests at least partly on a surface of an installation room and the Faraday cage floor has such a construction that the weight of contents of the Faraday cage is spread all over the floor of the Faraday cage;
wherein the floor of the cage includes a floor framework composed of one or more beams, which beams wholly rest on the surface floor of the room, said beams being provided in combination with load-bearing floor panels which rest on the floor framework, or are fastened on a side of the beams in a mechanically load-bearing manner.

33. A Faraday cage for Nuclear Magnetic Resonance applications, comprising walls which delimit a room, said walls being at least partially made of an electrically conductive material and connected to ground or to a predetermined potential, and a floor which rests at least partly on a surface of an installation room and the Faraday cage floor has such a construction that the weight of contents of the Faraday cage is spread all over the floor of the Faraday cage;
wherein the floor of the cage includes a floor framework composed of parallel beams, which are connected at their periphery to the rest of the cage, which beams wholly rest on the surface floor of the room, said beams being provided in combination with load-bearing floor panels which rest on the floor framework, or are fastened on a side of the beams in a mechanically load-bearing manner.

* * * * *